United States Patent
Yamaguchi

(10) Patent No.: US 8,305,155 B2
(45) Date of Patent: Nov. 6, 2012

(54) PHASE LOCKED LOOP CIRCUIT WITH VARIABLE VOLTAGE SOURCES

(75) Inventor: Kouichiro Yamaguchi, Osaka (JP)

(73) Assignee: Icom Incorporated, Osaka (JP)

( * ) Notice: Subject to any disclaimer, the term of this patent is extended or adjusted under 35 U.S.C. 154(b) by 55 days.

(21) Appl. No.: 12/755,502

(22) Filed: Apr. 7, 2010

(65) Prior Publication Data

US 2010/0253438 A1    Oct. 7, 2010

(30) Foreign Application Priority Data

Apr. 7, 2009    (JP) ................................. 2009-093093

(51) Int. Cl.
*H03L 7/085* (2006.01)
*H03L 1/00* (2006.01)

(52) U.S. Cl. ........... 331/185; 331/17; 331/186; 327/156
(58) Field of Classification Search .................... 331/16, 331/17, 34, 177 R, 185, 186; 327/147, 148, 327/156, 157; 375/373–376
See application file for complete search history.

(56) References Cited

U.S. PATENT DOCUMENTS

| | | | | |
|---|---|---|---|---|
| 5,929,677 A * | 7/1999 | Murata | .......................... | 327/157 |
| 6,667,663 B2 * | 12/2003 | Ozawa | ............................ | 331/17 |
| 6,933,869 B1 * | 8/2005 | Starr et al. | .................... | 341/120 |
| 7,042,277 B2 * | 5/2006 | Cranford et al. | .............. | 327/538 |
| 7,616,075 B2 * | 11/2009 | Kushiyama | .................... | 331/186 |

FOREIGN PATENT DOCUMENTS

JP    2008306231    12/2008

* cited by examiner

*Primary Examiner* — Levi Gannon
(74) *Attorney, Agent, or Firm* — Baker & McKenzie LLP

(57) ABSTRACT

A PLL circuit comprises a phase detector, a charge pump, a loop filter, a voltage-controlled oscillator (VCO), and two variable voltage sources. The phase detector and the charge pump each comprises low-voltage transistors, and operates with a fixed supply voltage VCC1 (e.g., 5 V) which is a potential difference applied from the variable voltage source of a power-supply voltage VL and the variable voltage source of a power-supply voltage VDC (=VL+VCC1). A tuning control signal VC generated by integrating an output current signal of the charge pump using the loop filter is input to the VCO having an input voltage range of the tuning control signal from 0 V to VCC2 (e.g., 16 V). At this time, the output voltage range of the tuning control signal is from VL to VDC, but the output voltage range is expanded to cover the full input voltage range from 0 V to VCC2 by controlling the output voltages VL, VDC of the variable voltage sources, thereby allowing the VCO to output an output signal with a desired oscillation frequency.

5 Claims, 6 Drawing Sheets

PHASE LOCKED LOOP CIRCUIT WITH VARIABLE VOLTAGE SOURCES

CROSS-REFERENCE TO RELATED APPLICATION

This application claims the benefit of Japanese Patent Application No. 2009-093093, filed on Apr. 7, 2009, the entire disclosure of which is incorporated by reference herein.

TECHNICAL FIELD

This application relates generally to a phase locked loop circuit (hereinafter, "PLL circuit"), and more particularly, to a PLL circuit which is required to generate a high voltage signal as a tuning control signal.

BACKGROUND

PLL circuits enable a stable oscillation output signal with low phase noise in a certain frequency range by performing feedback control on a tuning control signal input to a voltage-controlled oscillator. In order to reduce phase noise in the oscillation output voltage of the PLL circuit, it is necessary to configure the PLL circuit using a voltage-controlled oscillator with good phase noise characteristics in a wide oscillation frequency range. Most voltage-controlled oscillators with good phase noise characteristics have a wide input range of the tuning control signal. In order to maximize the oscillation frequency range, the PLL circuit is required to output a tuning control signal in a wide voltage range. Below, a PLL circuit which can generate a tuning control signal in a wide voltage range from a low voltage to a high voltage is called a high-voltage PLL circuit.

Conventional high-voltage PLL circuits are generally used as analog PLL circuits, and comprise a charge pump which can output a high-voltage signal. FIG. 5 shows a conventional PLL circuit (first example conventional technology).

The high-voltage PLL circuit comprises a phase detector 1, a level shifter 2, a charge pump 3, a loop filter 4, and a voltage-controlled oscillator (hereinafter, "VCO") 5. In those units, the phase detector 1 is supplied with a power-supply voltage VCC1 (e.g., 5 V) which is the same value as a power-source voltage supplied to an external controller or the like, and the charge pump 3 is supplied with a power-supply voltage VCC2 (e.g., 16 V) to cause the charge pump 3 to output a high-voltage tuning control signal VC. The VCO 5 is supplied with a power-supply voltage VCC3 (e.g., 8 V). The input voltage range of the tuning control signal VC of the VCO 5 is from 0 V to VCC2. Note that the level shifter 2 is supplied with the power-supply voltage VCC1 and the power-supply voltage VCC2.

The phase detector 1 compares the phase of an output signal OUT from the VCO 5 input through a capacitor 6a with the phase of a reference frequency signal REF supplied from an external reference oscillator 7 through a capacitor 6b, and outputs a pulse signal UP or a pulse signal DN depending on a comparison result. Note that the phase detector 1 includes a divider which performs frequency division on the output signal OUT of the VCO 5 in accordance with a control signal CTRL supplied from an external controller or the like, and the phase detector 1 compares the phase of the output signal OUT having undergone frequency division with the phase of the reference frequency signal REF.

The level shifter 2 performs level shifting on the pulse signal UP or the pulse signal DN output by the phase detector 1 to the input level of the charge pump 3 to output the level shifted signal as a pulse signal UPS, or a pulse signal DNS. Depending on which signal is input: the pulse signal UPS; or the pulse signal DNS, the charge pump 3 generates a current signal with the same fixed magnitude but of a different polarity: positive or negative for the time width of the input pulse signal.

The loop filter 4 is an integration circuit which eliminates high-frequency components from the current signal output by the charge pump 3, and generates a tuning control signal VC for the VCO 5. The VCO 5 generates an output signal OUT having an oscillation frequency which is controlled by a voltage input VC.

In the high-voltage PLL circuit, the phase detector 1 including the divider, the level shifter 2 and the charge pump 3 are integrated on a single chip by utilizing a high-voltage semiconductor process. In those units, the phase detector 1 comprises low-voltage transistors so as to be able to perform high speed operation, and the level shifter 2 and the charge pump 3 comprise high-voltage transistors so as to be able to output a current signal at a high voltage. Note that the capacitors 6a, 6b, the loop filter 4 which utilizes passive elements, and the high-performance VCO 5 which is difficult to be realized as an integrated circuit constitute the high-voltage PLL circuit as external units of the foregoing integrated circuit.

The high-voltage PLL circuit roughly operates as follows. The output signal OUT of the VCO 5 is supplied to a load circuit of a non-illustrated wireless radio front-end or the like and is also fed back to the phase detector 1 through the coupling capacitor 6a. The phase detector 1 causes the divider in the phase detector 1 to perform frequency division on the input signal OUT at a frequency-division ratio set by the control signal CTRL, and compares the phase of the signal having undergone frequency division with the phase of the reference frequency signal REF.

The phase detector 1 outputs a pulse signal UP or a pulse signal DN expressed with two voltage levels, 0 V and VCC1 (i.e., 5 V) depending on advancement or retardation of the phase of the output signal OUT relative to the phase of the reference frequency signal REF. Note that the pulse width of the pulse signal UP or the pulse signal DN is equivalent to the phase difference in time.

The level shifter 2 converts the pulse signal UP and the pulse signal DN to the pulse signal UPS and the pulse signal DNS expressed with two voltage levels, 0 V and VCC1 (i.e., 16 V), and inputs such signals into the charge pump 3. The charge pump 3 outputs a positive or negative constant current signal to the loop filter 4 for a time width of the pulse signal UPS or the pulse signal DNS. For example, when the pulse signal UPS is supplied, a constant current flows out from the charge pump 3 to the loop filter 4. Conversely, when the pulse signal DNS is supplied, the same amount of constant current flows into the charge pump 3 from the loop filter 4. The power-supply voltage VCC2 (16 V) is supplied to the charge pump 3, so that the charge pump 3 can output either positive or negative current signal at an output voltage between 0 V and VCC2.

The loop filter 4 integrates the current signal output by the charge pump 3 to eliminate high-frequency components, generates a tuning control signal VC between 0 V and VCC2, and supplies such a signal to the VCO 5. The tuning control signal VC causes the VCO 5 to control the oscillation frequency of the output signal OUT.

Through the foregoing feedback operation, the output signal OUT having undergone frequency division by the divider in the phase detector 1 is controlled in such a manner as to have the same phase as that of the reference frequency signal REF.

The foregoing first example conventional technology relates to an analog high-voltage PLL circuit, but, also in all digital phase locked loop circuits (hereinafter, "ADPLL circuit") using a digital/analog converter (hereinafter, "DAC"), a function of generating a tuning control signal in a wide voltage range from a low voltage to a high voltage is employed to configure a high-voltage ADPLL circuits.

One of the characteristics of the ADPLL circuits is that a digital loop filter can be used. The loop filter 4 of the analog PLL circuits generally comprises an external passive element. Accordingly, the loop filter 4 has problems that a large mounting area is necessary, the filter parameters varies within the tolerance of the characteristics of the element, dynamical change of the filter parameters is difficult, and formation of higher-order filter is problematic. In contrast, the digital loop filter has some advantages like, no mounting space is required because it can be implemented inside an integrated circuit, there is no variability in the filter characteristics because filtering is carried out through a logical operation, the filter parameters can be easily changed dynamically by configuring a programmable filter circuit, and formation of a high-order filter is easy. Therefore, the digital loop filter can overcome some of the problems of the analog loop filter.

FIG. 6 shows a configuration of a high-voltage ADPLL circuit as a second example conventional technology. The high-voltage ADPLL circuit comprises a digital phase detector 1D, a digital loop filter 4D, a DAC 8, an operational amplifier (OP) 9, and a VCO 5. In those units, the digital phase detector 1D, the digital loop filter 4D, and the DAC 8 are supplied with a power-supply voltage VCC1 (e.g., 5 V), the operational amplifier 9 is supplied with a power-supply voltage VCC2 (e.g., 16 V) to cause it to output at a high voltage, and the VCO 5 is supplied with a power-supply voltage VCC3 (e.g., 8 V). A tuning control signal VC to the VCO 5 is within an input voltage range from 0 V to VCC2.

The digital phase detector 1D compares the phase of an output signal OUT of the VCO 5 with the phase of a reference frequency signal REF, acquires a phase difference including + or − sign, converts the phase difference into a digital value, and output such a digital value as a phase difference signal. Note that the digital phase detector 1D includes a divider which performs frequency division on the output signal OUT of the VCO 5 according to a control signal CTRL supplied from an external controller or the like, and the digital phase detector 1D compares the phase of a signal having undergone frequency division with the phase of the reference frequency signal REF.

The digital loop filter 4D eliminates high-frequency components from the phase difference signal output by the digital phase detector 1D, and outputs a filtered digital signals. The DAC 8 converts the digital signal output by the digital loop filter 4D into a quantized analog voltage signal from 0 V to VCC1, and outputs such a signal. The operational amplifier 9 amplifies the output voltage signal of 0 V to VCC1 output by the DAC 8 by K times (K=VCC2/VCC1; voltage gain) in order to generate a tuning control signal VC from 0 V to VCC2 which is necessary for the VCO 5. The operational amplifier 9 may be also utilized to apply analog filtering to the output of the DAC 8. The VCO 5 generates an output signal OUT having an oscillation frequency which is controlled by a voltage input VC.

In the high-voltage ADPLL circuit, the digital phase detector 1D, the digital loop filter 4D, DAC 8, and the operational amplifier 9 are integrated on a single chip by utilizing a high voltage semiconductor process. In those units, the digital phase detector 1D, the digital loop filter 4D, and the DAC 8 comprises low-voltage transistors so as to be able to perform both high speed and low power operation. In contrast, the operational amplifier 9 comprises high-voltage transistors so as to be able to output a high-voltage signal. Moreover, the VCO 5 which is difficult to be realized as an integrated circuit constitutes the PLL circuit as an external unit of the foregoing integrated circuit.

According to the high-voltage ADPLL circuit, in comparison with analog high-voltage PLL circuits, there is a difference that internal signals are not analog signal but quantized discrete-time signal. However, like the analog high-voltage PLL circuits, feedback control is performed on the tuning control signal VC in such a way that the phase of the output signal OUT having undergone frequency division by the divider in the digital phase detector 1D matches the phase of the reference frequency signal REF.

Note that Unexamined Japanese Patent Application KOKAI Publication No. 2008-306231 discloses a PLL circuit in which either one of two kinds of pulse signals UP and DN output by a phase detector that can operate with a low power-supply voltage is input into a first differential circuit and a second differential circuit both of which can operate with a high power-supply voltage, and a charge pump outputs an up-current signal or a down-current signal depending on which signal is input: the pulse signal UP, or the pulse signal DN.

SUMMARY

Conventional high-voltage analog PLL circuits have following problems.

(1) In general, a high-voltage transistor requires a very large area to be installed in an integrated circuit, in comparison with a low-voltage transistor under the same operating current condition. Therefore, the high-voltage charge pump 3 has a larger die (chip) area than a low-voltage charge pump, both of which output the same operating current, resulting in a high cost.

(2) In order to reduce the cost, when the die area of the charge pump 3 comprised of high-voltage transistors is reduced, the operating current is also reduced. When the output current of the charge pump 3 becomes small, phase noise of a PLL's oscillator output signal increases, the lock-in range of the PLL decreases, and PLL lock time increases, resulting in deterioration of the performance.

(3) In general, high-voltage transistors have a large parasitic capacitance in comparison with low-voltage transistors under the same operating current condition, so that the operation speed becomes slow. Accordingly, the charge pump 3 which enables a high voltage tuning control signal output becomes a slow circuit. Moreover, when the level shifter 2 performs level conversion on the pulse signal UP and pulse signal DN from a low voltage level to a high voltage level, a large delay of the signal occurs. Therefore, when the level shifter 2 and the charge pump 3 are combined as shown in FIG. 5, the response time becomes further long in comparison with a low voltage charge pump 3 operating without a level shifter 2.

The charge pump 3 needs to output a constant current for a time corresponding to a pulse width of the pulse signal UPS or a pulse signal DNS. Therefore, the charge pump 3 is required to respond to the pulse signal UPS or the pulse signal DNS precisely and with sufficiently high speed. Because of the foregoing reasons, when the phase detector 1 comprised of low-voltage transistors and the charge pump 3 comprised of high-voltage transistors are combined together, the charge pump 3 needs a longer time until the charge pump 3 responds to an output of the phase detector 1, so that it becomes difficult for the charge pump 3 to precisely respond to a short pulse signal UP or a short pulse signal DN. This results in expansion of a dead zone which is a minimum input pulse width to sense a PLL phase error, and it is not desirable because the phase noise of the PLL increase.

(4) In general, a high-voltage transistor has a high saturation voltage (in a case of a MOS transistor, drain-source saturation voltage) in comparison with a low-voltage transistor under the condition of the same operating current and the same die area. The charge pump 3 is required to maintain a high output impedance up to a low output voltage like less than or equal to 0.5 V, and to output a precise current. When a charge pump 3 is configured by a high-voltage transistor having a high saturation voltage, the operation at a low output voltage becomes difficult.

(5) The charge pump 3 comprised of high-voltage transistors may be sometimes operated at an output voltage lower than the breakdown voltage of the high voltage transistor. For example, a high voltage PLL IC manufactured using a 40 V CMOS (Complementary Metal Oxide Semiconductor) process may be used to control a VCO 5 with a maximum tuning voltage of 16 V. In this case, it is reasonable to set the power-supply voltage VCC2 to 16 V instead of 40 V, to save the power consumption of the PLL IC. However, when a high-voltage transistor is operated at a voltage less than the maximum rated voltage, the operation speed generally becomes slow, and the high-voltage transistor does not operate at all in the worst case. Accordingly, when the charge pump 3 is used at a power-supply voltage in accordance with an input specification of a tuning voltage of the external VCO 5, performance degradation is probable in comparison with a case in which the charge pump 3 is operated with the maximum rated voltage. That is, it is difficult to accomplish power saving while maintaining a predetermined performance.

Moreover, conventional high-voltage ADPLL circuits have following problems.

(6) As explained in (3), a high-voltage transistor generally has a larger parasitic capacitance than a low-voltage transistor, hence the operational amplifier 9 comprised of high-voltage transistors becomes a slower circuit than low-voltage amplifiers used inside, for example, the DAC 8. Accordingly, when, for example, a carrier wave is modulated by an ADPLL, if the operational amplifier 9 is used, it becomes difficult to respond to a high speed modulation signal in comparison with a case in which the DAC 8 and the VCO 5 are directly connected together.

(7) When a high-voltage operational amplifier 9 is used, due to the noise generated in the operational amplifier 9, the phase noise in a PLL's oscillator output increases in comparison with a case in which the DAC 8 and the VCO 5 are directly connected together.

(8) As the output signal of the DAC 8 is amplified by the operational amplifier 9 by K times, the resolution for the tuning voltage VC is scaled down by K times from that of the DAC 8. Furthermore, the voltage gain K is not a precise constant and varies nonlinearly against output voltage due to various error factors of the operational amplifier 9. Accordingly, the frequency precision of the output signal OUT from the PLL circuit and the spurious characteristics thereof are likely to deteriorate in comparison with a case in which the DAC 8 and the VCO 5 are directly connected together.

(9) Because of the same reason as explained in (5), when the operational amplifier 9 comprised of high-voltage transistors with a breakdown voltage of, for example, 40 V is used with a power-supply voltage less than 40 V (e.g., 16 V), the performance thereof generally suffers. Accordingly, it is difficult to accomplish power-saving of the high-voltage ADPLL circuit while maintaining a predetermined performance.

(10) Because of the same reason explained in (4), the operational amplifier 9 comprised of high-voltage transistors with a high saturation voltage is likely to cause performance degradation in comparison with a low-voltage operational amplifier, when an output voltage of the operational amplifier 9 is extremely low. Accordingly, in the high-voltage ADPLL circuits, performance degradation is likely to occur in comparison with a case in which the DAC 8 and the VCO 5 are directly connected together, when the tuning voltage is exceedingly low.

The present invention has been made to overcome the foregoing problems, and it is an object of the present invention to provide a PLL circuit which comprises low-voltage transistors, is able to output a high-voltage tuning control signal, has a superior performance on phase error and frequency precision, and is inexpensive.

To achieve the object, a PLL circuit according to a first aspect of the present invention operates with, relative to a reference ground potential, a first supply voltage and a second supply voltage higher than the first supply voltage by a constant voltage, the PLL circuit comprises: a first variable voltage source which supplies the first supply voltage; a second variable voltage source which supplies the second supply voltage; a phase detector which operates with, as a power-supply voltage, a potential difference between the first supply voltage and the second supply voltage, compares a phase of an output signal input to the phase detector with a phase of a reference frequency signal, and outputs a phase difference signal corresponding to a phase difference between the two signals; a charge pump which operates with, as a power-supply voltage, a potential difference between the first supply voltage and the second supply voltage, and outputs a positive or negative constant current signal corresponding to the phase difference signal supplied from the phase detector; a loop filter which integrates the constant current pulse signal output by the charge pump to generate a tuning control signal, and outputs the tuning control signal; and a VCO which has an input voltage range of the tuning control signal between the reference ground potential and a third supply voltage, generates the output signal having an oscillation frequency controlled by the tuning control signal, and outputs the generated output signal.

According to the foregoing PLL circuit, the first variable voltage source, the second variable voltage source, the phase detector, and the charge pump may be integrated on at least one semiconductor die.

The foregoing PLL circuit may further comprise a divider which performs frequency division on the output signal of the VCO according to a control signal supplied from an external controller, and supplies the signal having undergone frequency division to the phase detector.

The control signal is supplied from the external controller as a first logic signal representing a logical value 0 with the reference ground potential and a logical value 1 with a fixed low-voltage (a fixed fourth supply voltage), and the PLL circuit may further comprise a level shifter which converts the first logic signal into a second logic signal representing a logical value 0 and 1 by the first supply voltage and the second supply voltage respectively, and supplies the second logic signal to the divider.

When the divider is further provided, the first variable voltage source, the second variable voltage source, the phase detector, the charge pump, the divider and the level shifter may be integrated on at least one semiconductor die.

The control signal may be supplied from the external controller as a first logic signal representing a logical value 0 with the reference ground potential and a logical value 1 with a fixed low-voltage (a fixed fourth supply voltage), and the PLL circuit may further comprise: a first level shifter which converts the first logic signal into a second logic signal representing a logical value 0 and 1 by the first supply voltage and the second supply voltage respectively; and a second level shifter which converts an internal state logic signal represented by the first supply voltage and the second supply voltage into a logic signal which is to be output to the external controller and which represents a logical value 0 with the reference ground potential and a logical value 1 with a fixed low-voltage.

The first variable voltage source, the second variable voltage source, the phase detector, the charge pump, the divider, the first level shifter and the second level shifter may be integrated on at least one semiconductor die.

A PLL circuit according to a second aspect of the present invention comprises: a phase detector to which a first power-supply voltage is supplied, which is grounded to a reference potential to operate, and which outputs a phase difference signal corresponding to a phase difference between a reference frequency signal and an output signal input to the phase detector; a charge pump to which the first power-supply voltage is supplied, which is grounded to the reference potential to operate, and which outputs a positive or negative constant current signal corresponding to the phase difference signal supplied from the phase detector; a loop filter which integrates the constant current pulse signal output by the charge pump to generate and output a tuning control signal; a VCO which has an input voltage range of the tuning control signal that is a first potential difference larger than the first power-supply voltage, which is grounded to a first potential different from the reference potential, which generates and outputs the output signal having an oscillation frequency controlled by the input tuning control signal; and a voltage source which applies a second potential difference between the reference potential and the first potential.

The variable voltage source may have the second potential difference controlled according to a signal supplied from an external controller. The phase detector, the charge pump, and the variable voltage source may be integrated on at least one semiconductor die.

The PLL circuit may further comprise a divider which performs frequency division on the output signal of the VCO according to a control signal supplied from an external controller, and supplies the signal having undergone frequency division to the phase detector. In this case, the phase detector, the charge pump, the divider and the variable voltage source may be integrated on at least one semiconductor die.

A PLL circuit according to a third aspect of the present invention operates with, relative to a reference ground potential, a first supply voltage and a second supply voltage higher than the first supply voltage by a constant voltage, the PLL circuit comprises: a first variable voltage source which supplies the first supply voltage; a second variable voltage source which supplies the second supply voltage; a digital phase detector which operates with, as a power-supply voltage, a potential difference between the first supply voltage and the second supply voltage, compares a phase of an output signal input to the phase detector with a phase of a reference frequency signal, and outputs a digital phase difference signal corresponding to a phase difference between the two signals; a digital loop filter which operates with, as a power-supply voltage, a potential difference between the first supply voltage and the second supply voltage, eliminates high-frequency components from the digital phase difference signal to generate a digital tuning control signal and outputs the digital tuning control signal; a DAC which operates with, as a power-supply voltage, a potential difference between the first supply voltage and the second supply voltage, converts the digital tuning control signal output by the digital loop filter into an analog voltage signal, and outputs the analog voltage signal as a tuning control signal; and a VCO which has an input voltage range of the tuning control signal between the reference ground potential and a third supply voltage, generates and outputs the output signal having an oscillation frequency controlled by the tuning control signal.

The PLL circuit may further comprise a constant voltage source supplying a third supply voltage, and wherein the first variable voltage source may operate with a power-supply voltage less than or equal to the third supply voltage, and the second variable voltage source may operate with, as a power-supply voltage less than or equal to the third supply voltage.

The first variable voltage source, the second variable voltage source, the digital phase detector, the digital loop filter, and the DAC of the PLL circuit may be integrated on at least one semiconductor die.

The PLL circuit may further comprise a divider which performs frequency division on the output signal of the VCO according to a control signal supplied from an external controller, and supplies the signal having undergone frequency division to the digital phase detector. The control signal is supplied from the external controller as a first logic signal representing a logical value 0 with the reference ground potential and a logical value 1 with a fixed fourth supply voltage, and the PLL circuit may further comprise a level shifter which converts the first logic signal into a second logic signal representing a logical value 0 and 1 by the first supply voltage and the second supply voltage respectively, and supplies the second logic signal to the divider. In this case, the first variable voltage source, the second variable voltage source, the digital phase detector, the digital loop filter, the DAC, the divider, and the level shifter are integrated on at least one semiconductor die.

According to the present invention, in the PLL circuit, a circuit block having inputs that are a reference frequency signal and an output signal of the VCO and having an output that is a control signal to the VCO is configured as a low-voltage circuit grounded to a first ground potential. The VCO requiring inputting of a high-voltage tuning control signal is grounded to a second ground potential different from the first ground potential. A variable potential difference is applied between the first ground potential and the second ground potential. Accordingly, it becomes possible to output a high-voltage tuning control signal using the circuit block comprised of low-voltage transistors, so that the PLL circuit which has superior performances in phase error and in frequency precision, and which is inexpensive can be realized.

BRIEF DESCRIPTION OF THE DRAWINGS

A more complete understanding of this application can be obtained when the following detailed description is considered in conjunction with the following drawings, in which.

DETAILED DESCRIPTION

First Embodiment

Figure 1:
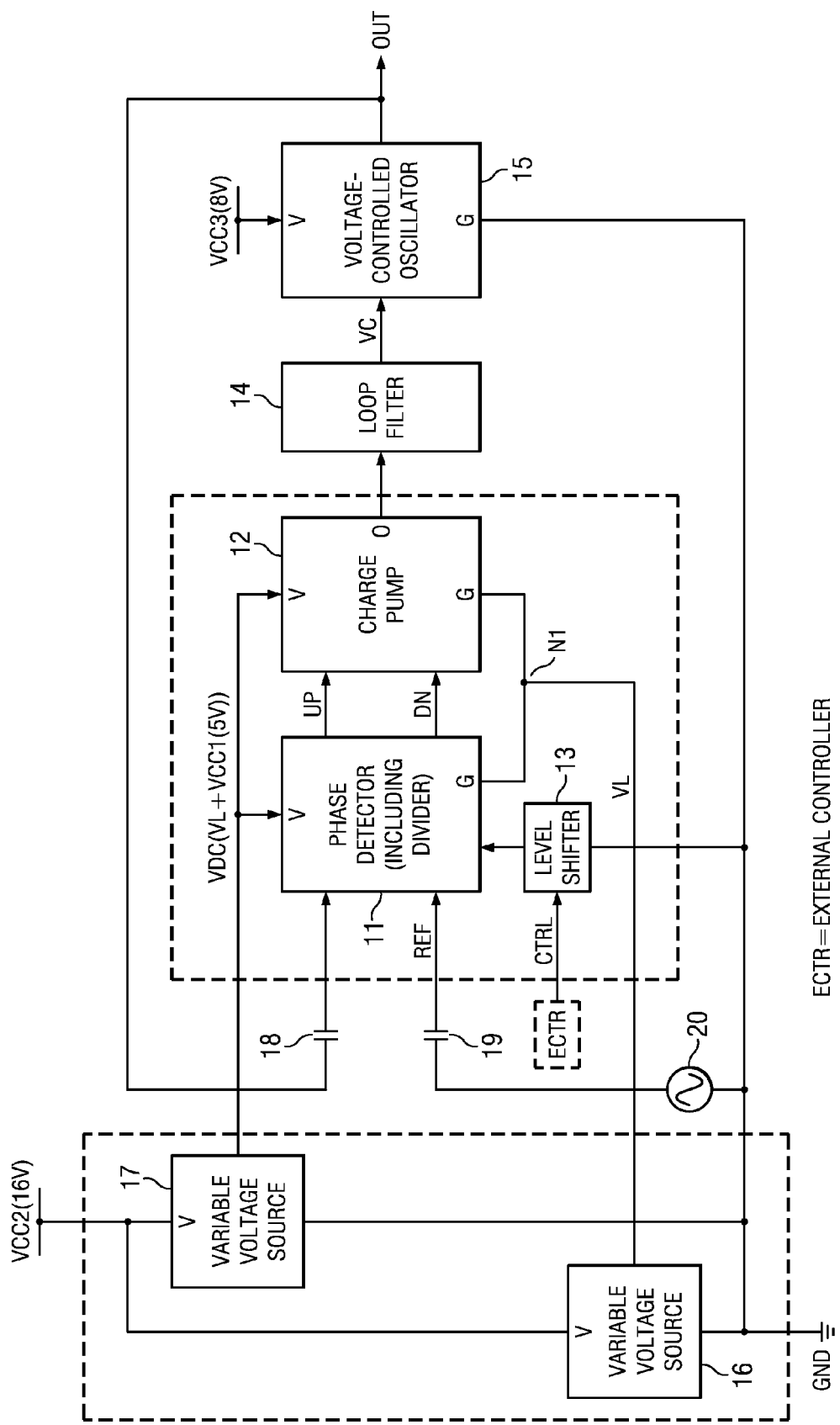
FIG. 1 is a configuration diagram showing a PLL circuit according to a first embodiment of the present invention.

As shown in FIG. 1, a PLL circuit according to the first embodiment of the present invention comprises a phase detector 11, a charge pump 12, a level shifter 13, a loop filter 14, a VCO 15, and variable voltage sources 16, 17.

In those units, a ground terminal G of the phase detector 11 and that of the charge pump 12 are connected to a node N1 where a variable supply voltage VL with respect to a reference potential GND is supplied from the variable voltage source 16. A variable supply voltage VDC (=VL+VCC1) with respect to the reference potential GND is supplied from the variable voltage source 17 to a power-supply terminal V of the phase detector 11 and that of the charge pump 12 respectively. The variable voltage sources 16, 17 are connected to a voltage source which supplies a power-supply voltage VCC2 (e.g., 16 V). VCC1 is a fixed voltage (e.g., 5 V) less than or equal to the breakdown voltage of the low-voltage transistor employed in the PLL circuit. VL is an output voltage of the variable voltage source 16, and changes according to a control signal (not illustrated) supplied from the exterior or the interior of the PLL circuit.

In contrast, a ground terminal G of the VCO 15 is connected to a reference potential GND common to the ground potential of an external controller or the like, and a power-supply voltage VCC3 (e.g., 8 V) is supplied to a power-supply terminal V of the VCO 15. The input voltage range of a tuning control signal VC for the VCO 15 is from 0 V to VCC2.

The phase detector 11 includes a divider having a frequency division ratio set by a control signal CTRL supplied from the external controller or the like through the level shifter 13. The divider performs frequency division on an output signal OUT of the VCO 15 input into the phase detector 11 with the set frequency division ratio, and outputs a signal having undergone frequency division. The phase of the output signal OUT having undergone frequency division is compared with the phase of a reference frequency signal REF, and a pulse signal UP or a pulse signal DN is output depending on a comparison result.

The charge pump 12 outputs a current signal with the same fixed magnitude but of a different polarity: positive or negative from an output terminal O thereof for a time width of the pulse signal UP or the pulse signal DN in accordance with such a pulse signal supplied from the phase detector 11. For example, the charge pump 12 has a constant current source which allows a constant current to flow out from the output terminal O, and a constant current source which allows the same amount of constant current to flow into the output terminal O. The charge pump 12 switches on and off these current sources according to the pulse signal UP or the pulse signal DN. The output voltage range of the charge pump 12 is roughly from VL to VDC (=VL+VCC1).

The level shifter 13 performs level shifting on the control signal CTRL supplied from the external controller or the like from an expression representing a logical value 0 with the reference potential (0 V) and a logical value 1 with a predetermined potential (e.g. the supply voltage of the external controller), to an expression representing a logical value 0 with the potential VL and a logical value 1 with the potential VDC. The control signal CTRL having undergone level shifting is supplied to, for example, the divider in the phase detector 11. The level shifter 13 may utilize energy transformers such as electromagnetic coils or an LED and a photo-detector to isolate its input-side logic circuit and output-side logic circuit. In some cases, it is necessary to send information such as the state of PLL lock to the external controller. The level shifter 13 may be designed for two-way data transfer, for this purpose.

The loop filter 14 is an integration circuit which eliminates high-frequency components of a current signal output by the charge pump 12, and generates the stable tuning control signal VC to be supplied to the VCO 15, and generally comprises passive elements, such as resistors, and capacitors. The VCO 15 generates the output signal OUT having an oscillation frequency according to the tuning control signal VC.

The variable voltage sources 16, 17 are caused to control respective power-supply voltage VL and power-supply voltage VDC (=VL+VCC1) based on a control signal from the exterior of the PLL circuit or from the interior thereof. Note that the variable voltage source 17 changes the power-supply voltage VDC which is its output signal in accordance with a change in the power-supply voltage VL (e.g., 0 to 11 V). That is, the variable voltage source 17 outputs the power-supply voltage VDC always higher than the variable voltage source 16 by what corresponds to VCC1 (e.g., 5 V). The maximum value of the power-supply voltage VDC output by the variable voltage source 17 is equal to VCC2 which is the power-supply voltage thereto. Accordingly, the maximum value of the power-supply voltage VL output by the variable voltage source 16 is VCC2−VCC1.

In the PLL circuit, the phase detector 11, the charge pump 12, the level shifter 13, and the variable voltage sources 16, 17 all surrounded by a dashed line in FIG. 1 are integrated on a single chip by utilizing high-voltage semiconductor manufacturing processes. The phase detector 11 and the charge pump 12 are each comprised of, for example, low-voltage transistors having a breakdown voltage of 5 V. The level shifter 13 and the variable voltage sources 16, 17 are each comprised of low-voltage transistors having a breakdown voltage of 5 V and high-voltage transistors. Note that the loop filter 14 comprised of passive elements, the capacitors 18, 19 and the high-performance VCO 15 which is difficult to integrate are configured as external units.

Next, an explanation will be given of an operation of the PLL circuit shown in FIG. 1. The power-supply voltage VL with reference to the reference potential GND is supplied from the variable voltage source 16 to the ground terminal G of the phase detector 11 and that of the charge pump 12. In contrast, the power-supply voltage VDC which is higher than the power-supply voltage VL by VCC1 (e.g., 5 V) is supplied from the variable voltage source 17 to the power-supply terminal V of the phase detector 11 and that of the charge pump 12. Therefore, the phase detector 11 and the charge pump 12 operate with the net power-supply voltage VCC1 (5 V). The operating voltage is within the breakdown voltage of the low-voltage transistor, so that it is possible for the phase detector 11 and the charge pump 12 to operate normally and with high speed. In contrast, as explained above, the input voltage range of the tuning control signal VC for the VCO 15 is from 0 V to VCC2, apparently exceeding the output voltage range of the charge pump 12.

Prior to operation of the PLL circuit, in order to set the frequency division ratio of the divider in the phase detector 11, the control signal CTRL is applied. The control signal CTRL is generally applied as a serial logic signal of a low voltage (e.g., 3.3 V) relative to the reference potential GND. Accordingly, the control signal CTRL is supplied to the level shifter 13, and the level shifter 13 converts a signal representing a logical value 0 with the reference potential GND and a logical value 1 with, for example, 3.3 V to a signal representing a logical value 0 with the potential VL and a logical value 1 with the potential VDC, and such a signal is supplied to the phase detector 11. Accordingly, the divider in the phase detector 11 is set to a desired frequency division ratio. Note that the control signal CTRL is applied not only for initial setting but also for changing the oscillation frequency of the output signal OUT during operation.

The output signal OUT of the VCO 15 is supplied to a non-illustrated load circuit (e.g., a wireless radio device), and is also fed back to the phase detector 11 through the coupling capacitor 18. The phase detector 11 causes the internal divider to perform frequency division on the output signal OUT at the frequency division ratio set by the control signal CTRL, and compares the phase of the signal having undergone frequency division with the phase of the reference frequency signal REF. Regarding the output signal OUT and the reference frequency signal REF, only non-DC components are input into the phase detector 11 through the coupling capacitors 18, 19 respectively, so that no concern in direct-current levels is necessary for this connection. Accordingly, respective input signals to the phase detector 11 do not need level shifting. A reference oscillator 20 is externally connected to the integrated circuit. However, a crystal resonator or the like may be externally connected to the integrated circuit, such an resonator and a low-voltage transistor circuit with the supply voltage VL being as a ground potential may configure an oscillator in the integrated circuit, and such an oscillator may function as the reference oscillator 20 to generate the reference frequency signal REF in the integrated circuit.

The phase detector 11 generates the pulse signal UP or the pulse signal DN depending on the sign and the magnitude of the difference in phase between the output signal OUT and the reference frequency signal REF. The voltage amplitude of the pulse signal UP, DN is VCC1, is smaller than the breakdown voltage of the low-voltage transistor. Note that the pulse widths of the pulse signal UP and the pulse signal DN are proportional to the phase difference in time. That is, the larger the phase difference is, the larger the pulse width becomes, and when the two phases completely match so that there is no phase difference, no pulse signal UP, DN is output. However, as there may appear a low gain region known as the dead zone in the response of the phase detector 11 near the zero phase difference of the inputs, a delay may be added to the output pulses to eliminate the dead zone.

The charge pump 12 outputs a positive or negative constant current signal to the loop filter 14 for a time width of the pulse signal UP or the pulse signal DN. For example, when the pulse signal UP is applied, the charge pump 12 sources a constant current to the loop filter 14. Conversely, when the pulse signal DN is applied, the same amount of constant current sinks into the charge pump 12 from the loop filter 14. At this time, the output voltage range of the charge pump 12 is roughly from VL to VL+VCC1 with reference to the reference potential GND.

The loop filter 14 eliminates high-frequency components by integrating a current pulse signal output by the charge pump 12, generates the stable tuning control signal VC, and supplies the tuning control signal VC to the VCO 15. The frequency of the output signal OUT of the VCO 15 is controlled based on the tuning control signal VC. Through a feedback operation in this fashion, the output signal OUT of the VCO 15 is controlled in such a way that the output signal OUT having undergone frequency division by the divider in the phase detector 11 has a phase matching with the reference frequency signal REF.

However, the voltage range of the tuning control signal VC output by the charge pump 12 is limited from VL to VL+VCC1. Accordingly, when it is necessary to supply the tuning control signal VC within a voltage range from 0 V to VCC2 to the VCO 15, only a part of such voltage range can be covered. In this case, it is possible to shift the voltage range of the tuning control signal VC output by the charge pump 12 by changing the power-supply voltages output by respective variable voltage sources 16, 17.

For example, when VCC1=5 V and VL=3 V, the charge pump 12 can output the tuning control signal VC within a range substantially from 3 to 8 V. In order to cause the VCO 15 to oscillate at a desired frequency, when it is necessary to supply the tuning control signal VC of 10 V, if the power-supply voltage VL is increased by, for example, 3 V so as to be 6 V, the output voltage range of the charge pump 12 becomes 6 to 11 V. Accordingly, the charge pump 12 can output the tuning control signal VC of 10 V. Note that the level shifter 13 changes its output level in accordance with the change in the potential VL, and outputs a logic signal always represented by potentials of two values: VL; and VDC. Accordingly, irrespective of the value of VL, the level shifter 13 enables a communication between the external controller or the like and the PLL circuit without any problems.

The power supply lines for VL and VDC are decoupled by external bypass capacitors with values on the order of 1 µF or more. Therefore, in order to change the power-supply voltage VL by several V or so, for example, a time of several ms to 10 ms is required, when the value of current consumption of the PLL IC were on the order of 1 mA. Accordingly, it takes a transition time on the order of 10 ms when large oscillation frequency changes that cannot be achieved without changing the value of VL are required. However, in operation of land mobile radios e.g., a frequency transition time of 10 ms or more is well within the standard for the transient duration limits. Therefore, the transition time for large oscillation frequency changes in the PLL circuit of the first embodiment is allowable in many important applications.

In contrast, in the case of changing of the oscillation frequency within a range that it is not necessary to change the power-supply voltage VL, i.e., the required variation of the tuning control signal VC is within VCC1 (5 V), the PLL circuit of the embodiment can follow such a change at a sufficiently high speed. For example, in applications of outputting a frequency modulated signal or sweeping an adjacent channel, the PLL circuit of the embodiment can respond at high speed and no problem occurs.

As explained above, the PLL circuit of the first embodiment, which can output a high-voltage tuning control signal enabling to employ a low phase noise VCO 15, has following advantages over the conventional high-voltage PLL (a) Because the charge pump 12 can be comprised of low-voltage transistors, the semiconductor die area thereof becomes small in comparison with a case in which high-voltage transistors are used, thereby reducing the cost.

(b) Because the charge pump 12 can be comprised of low-voltage transistors, the charge pump 12 can output a large current using a transistor with a smaller area. In a case that high-voltage transistors are used, due to limited area and demands on switching speed, the maximum value for the output current of the charge pump 12 often remains insufficient, degrading performance of the PLL.

(c) Because the charge pump 12 uses transistors which operate at low-voltage and have a smaller area, the charge pump 12 can operate at a sufficiently high speed. When the charge pump 12 is incompetent for switching speed, the phase noise performance of the PLL will be suffered, offsetting the advantage of using a high-voltage VCO 15. Moreover, it is generally difficult to configure a Fractional-N PLL using such a slow charge pump 12.

(d) Because the current sources in the charge pump 12 are composed of low-voltage transistors that have a lower saturation voltage, the charge pump 12 can achieve a wider output voltage range, without increasing die area.

Figure 5:
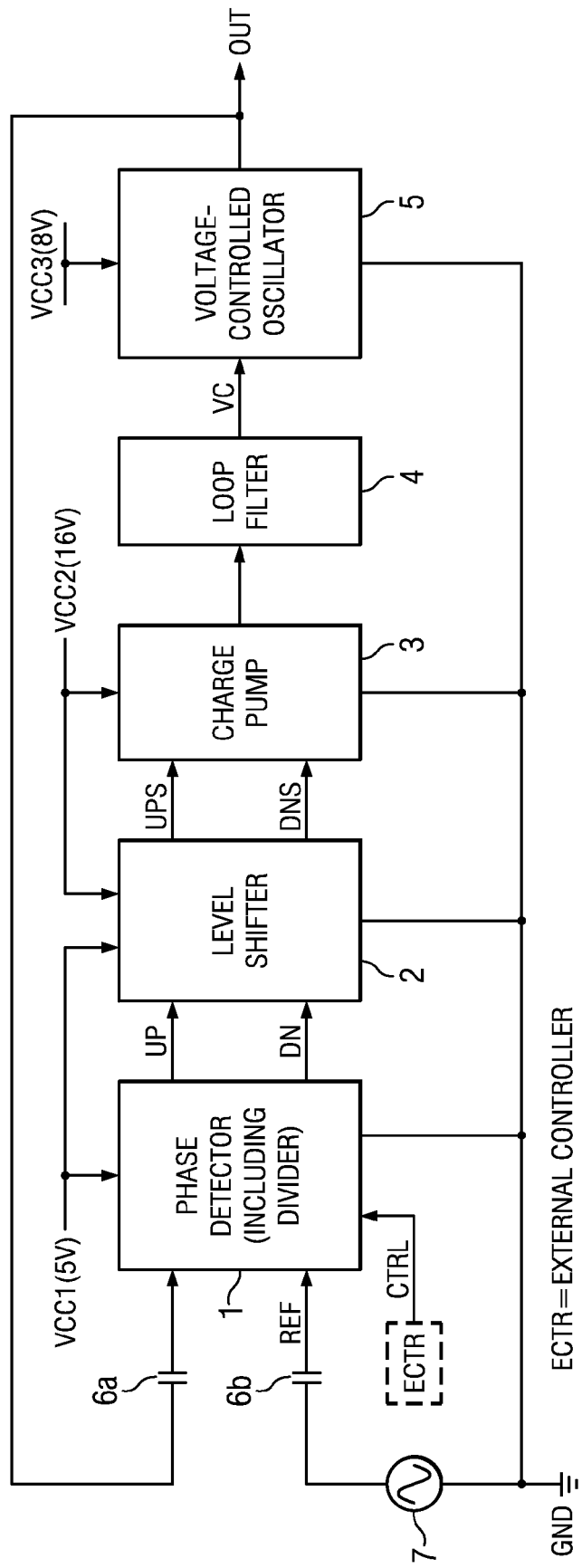
FIG. 5 is a configuration diagram showing a high-voltage PLL circuit of a first example conventional technology.

(e) When VDC, the power-supply voltage for the charge pump 12, is adequately high, the charge pump 12 can always operate with a sufficiently high switching speed, irrespective of the value of VCC2, the upper limit of the tuning control voltage. In a case the charge pump 12 comprises high-voltage transistors as in the conventional PLL shown in FIG. 5, the lower VCC2 is, the slower the switching speed becomes, degrading the performance of the PLL. While it is necessary for manufacturing a high-voltage PLL IC to choose a high-voltage CMOS process with a maximum rated drain-source voltage (e.g. 40V) higher than the expected maximum tuning control voltage given by the specification, it is desirable to set the value of VCC2 to the upper limit of the tuning control voltage in each specific implementation of the PLL (e.g. 8V in some cases), to minimize the power consumption.

Therefore, the PLL circuit of the embodiment can overcome the problems described in (1) to (5).

Second Embodiment

Figure 2:
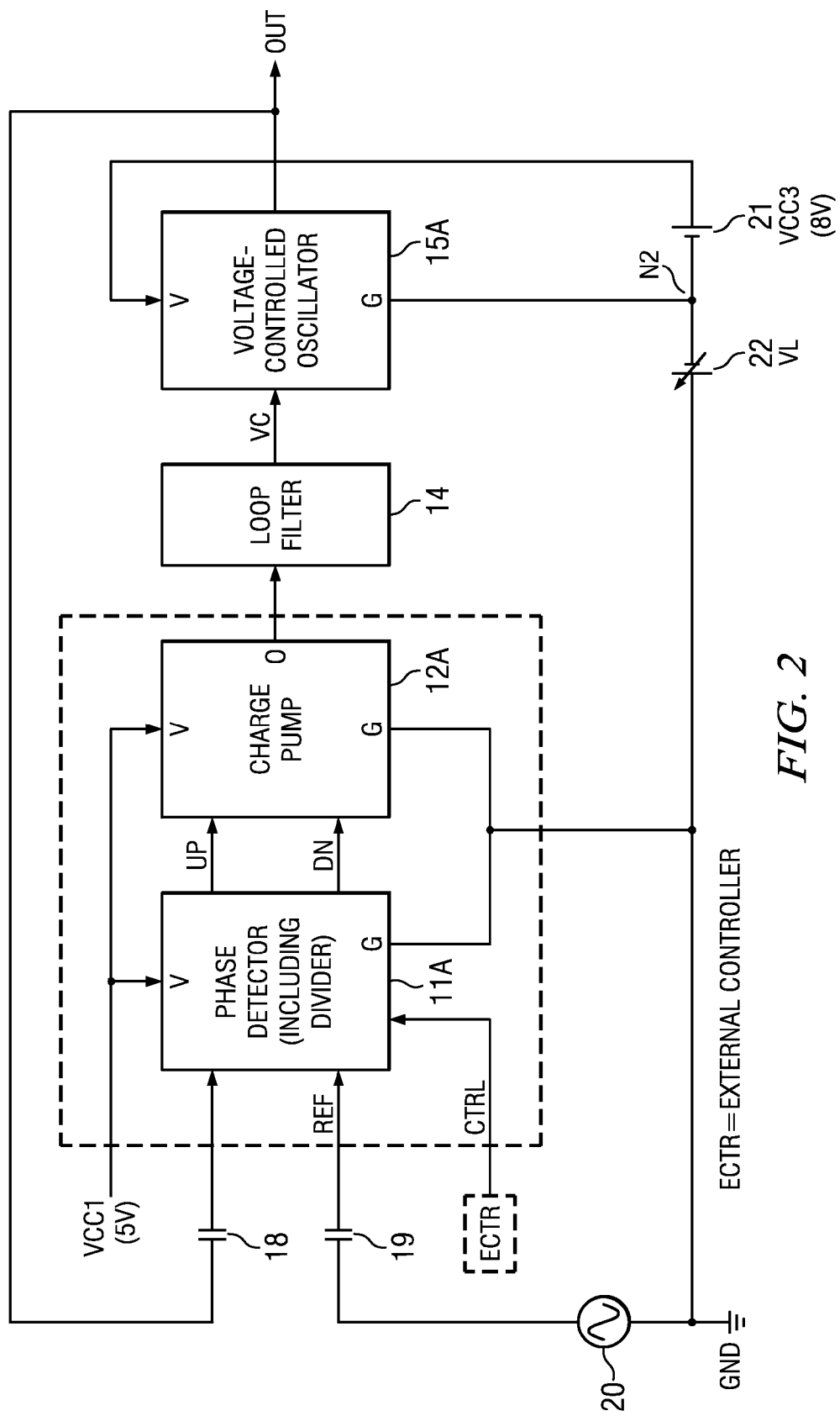
FIG. 2 is a configuration diagram showing a PLL circuit according to a second embodiment of the present invention.

A PLL circuit of the second embodiment comprises, as shown in FIG. 2, a phase detector 11A, a charge pump 12A, a loop filter 14, a VCO 15A, a constant voltage source 21 and a variable voltage source 22. The phase detector 11A, the charge pump 12A and the VCO 15A have the same function as that of the phase detector 11 and the like in FIG. 1, respectively, but the potential of each power supply line relative to the reference potential GND, common to the ground of the external controller, is different.

That is, a ground terminal G of the phase detector 11A and that of the charge pump 12A are connected to a reference potential GND, and a power-supply voltage VCC1 which is a low voltage (e.g., 5 V) relative to the reference potential GND is supplied to respective power-supply terminals V. The constant voltage source 21 is connected between a ground terminal G of the VCO 15A and a power-supply terminal V thereof, and a power-supply voltage VCC3 (e.g., 8 V) is supplied between the power-supply terminal V and the ground terminal G. Note that the power-supply voltage can also be supplied by another variable voltage source which are grounded to 0 V and outputs a supply voltage of VCC3−VL (VL is the output voltage of the variable voltage source 22, as described below.), instead of the constant voltage source 21. The input voltage range of the tuning control signal of the VCO 15A is from −VL to −VL+VCC2 when the ground voltage thereof is −VL. In this example, VCC2 is assumed to be 16 V.

Moreover, a ground terminal G of the VCO 15A is connected to a node N2, that is, a negative electrode of the variable voltage source 22. A positive electrode of the variable voltage source 22 is connected to the reference potential GND. The variable voltage source 22 outputs a variable voltage VL according to a non-illustrated control signal input to the variable voltage source 22. A variable range of VL is from 0 V to VCC2−VCC1, i.e., from 0 to 11 V for the example shown in FIG. 1. As explained above, the variable voltage source 22 gives a potential difference corresponding to the variable voltage VL between the reference potential GND to which the phase detector 11A and the charge pump 12A are grounded, and, the ground potential of the VCO 15A. A control signal CTRL from an external controller or the like to the phase detector 11A is directly applied without level shifting.

In the PLL circuit of the embodiment, the phase detector 11A and the charge pump 12A surrounded by a dashed line in the figure are integrated on a single chip using a semiconductor process for low-voltage, for example 5 V applications. The other configurations are the same as those of the first embodiment, so that duplicated explanation will be omitted in the embodiment.

Next, an explanation will be given of an operation of the PLL circuit shown in FIG. 2. The phase detector 11A and the charge pump 12A operate with the 5-V power-supply voltage VCC1 supplied between the ground terminal G and the power-supply terminal V. The control signal CTRL supplied from the external controller or the like to the divider in the phase detector 11A is a low-voltage serial logic signal relative to the reference potential GND, so that no level shifting is necessary and such a signal is directly supplied to the phase detector 11A.

The VCO 15A operates with the 8-V power-supply voltage VCC3 supplied from the constant voltage source 21 between the ground terminal G and the power-supply terminal V. An output signal OUT of the VCO 15A is supplied to a non-illustrated load circuit (e.g., a mixer) and is also fed back to the phase detector 11A through a coupling capacitor 18. The phase detector 11A causes the internal divider to perform frequency division on the output signal OUT at a frequency division ratio set by the control signal CTRL, and compares the phase of the output signal OUT having undergone frequency division with the phase of the reference frequency signal REF. Regarding the output signal OUT and the reference frequency signal REF, only AC components thereof are supplied to the phase detector 11A through coupling capacitors 18, 19, respectively, so that DC level mismatch between those signals and the bias level of inputs of the phase detector 11A can be permitted.

The phase detector 11A outputs a pulse signal UP or a pulse signal DN to the charge pump 12A depending on the sign of the phase difference between the output signal OUT and the reference frequency signal REF. The voltage amplitude of the pulse signal UP, DN is VCC1 (5 V). The pulse width of the pulse signal UP, DN is proportional to the magnitude of the phase difference. That is, the larger the phase difference is, the wider the pulse width becomes, and when phases completely match and there is no phase difference, neither a pulse signal UP nor a pulse signal DN is ideally output to the charge pump 12A.

The charge pump 12A outputs a positive or negative current of the same magnitude to the loop filter 14 for a time width of the pulse signal UP or the pulse signal DN. For example, when the pulse signal UP is applied, the charge pump 12A supplies a constant current to the loop filter 14. When the pulse signal DN is supplied, the charge pump 12A steers a current of the same magnitude out of the loop filter 14. The output voltage range of the charge pump 12A is roughly from 0 V to VCC1 (5 V) relative to the reference potential GND.

The loop filter 14 performs integration on the current pulse signal output by the charge pump 12A to eliminate high-frequency components, generates a stable tuning control signal VC, and supplies the tuning control signal VC to the VCO 15A. The oscillation frequency of the output signal OUT of the VCO 15A is controlled by the tuning control signal VC. Through a feedback operation in this fashion, the output signal OUT of the VCO 15A is controlled in such a manner as to have a phase and a frequency matched to the reference frequency signal REF.

The ground terminal G of the VCO 15A is connected to the node N2, and the potential at the node N2 is set to −VL by the variable voltage source 22 relative to the reference potential GND. The voltage range of the tuning control signal VC input into the VCO 15A is limited in a range from 0 to 5 V relative to the reference potential GND, but the level of the tuning control signal relative to the ground terminal G of the VCO 15A can be transitioned by changing the power-supply voltage VL output by the variable voltage source 22.

For example, when VL=3 V, the charge pump 12A can output the tuning control signal VC within a range from 3 to 8 V relative to the ground terminal G (i.e., the node N2) of the VCO 15A. When it is necessary to supply 10-V tuning control signal VC in order to cause the VCO 15A to oscillate at a desired frequency, if the power-supply voltage VL is increased by, for example, 3 V so as to be 6 V, the output voltage range of the charge pump 12A becomes 6 to 11 V relative to the node N2. Accordingly, it becomes possible for the charge pump 12 to output the tuning control signal VC of 10 V to the VCO 15A.

The high-performance VCO 15, 15A may be an external unit of the integrated circuit in some cases, which consumes a relatively-large current of 20 to 40 mA. The PLL circuit of the second embodiment needs the supply voltage VCC1 for the phase detector 11A and the charge pump 12A that is grounded to the reference potential GND, and the constant voltage source 21 which is able to output a large current for the VCO 15A and which has a separate ground potential from the reference potential GND. The variable voltage source 22 is required to stably maintain the potential difference between the reference potential GND and the ground potential of the VCO 15A to an arbitrary value between 0 V to VCC2−VCC1. When a series regulator is used as the variable voltage source 22, it needs a minus supply voltage (VCC1−VCC2) for operation. As mentioned before, the constant voltage source 21 can be replaced with a variable voltage source which operates coordinately with the output voltage VL of the variable voltage source 22 so as to output a supply voltage of VCC3−VL relative to the ground potential GND to the power-supply terminal V of the VCO 15A. If this variable voltage source is realized as a series regulator, it needs a supply voltage of VCC3 relative to the ground potential GND. Moreover, both of the variable voltage sources must be able to steer the drive current for the VCO 15A. Therefore, the power-supply system of the second embodiment tends to become more complex and large in size, when it is realized by employing series regulators, so that it is difficult to accomplish cost reduction by circuit integration.

In contrast, in the first embodiment, it is sufficient if the variable voltage source 16 stabilizes its output voltage to an arbitrary value VL between 0 V to VCC2−VCC1. It is required for the variable voltage source 17 to maintain its output voltage to VL+VCC1. If the variable voltage source 17 is implemented as a series regulator, hence its supply voltage must be at least VCC2. Note that when the variable voltage source 16 is realized as a series regulator, the input voltage for the regulator may be taken from the node N1, and its output voltage is supplied to the ground line GND. The variable voltage sources 16, 17 regulate relatively small drive currents of the PLL components (divider, phase detector 11, charge pump 12). Accordingly, the variable voltage sources 16, 17 can be easily realized at a low cost by forming a relatively small variable voltage source in the integrated circuit.

The PLL circuit of the second embodiment has the advantages explained in (a) to (e) because the charge pump 12A is comprised of low-voltage transistors. Moreover, because the ground terminal G of the phase detector 11A is at the same level as the reference potential GND, there is an advantage that the external control signal CTRL can be directly input into the divider inside the phase detector 11A without through the level shifter. Moreover, by causing unnecessary current not to flow into the variable voltage source 22, it is possible to reduce the power consumption of the whole PLL circuit when the constant voltage source 21 is realized by using a battery for example, in comparison with the first embodiment.

Third Embodiment

The explanation has been given of the analog PLL circuits using the charge pump 12, 12A in the first and second embodiments, but the present invention can be applied to an ADPLL circuit using a DAC to enhance the performance of the PLL circuit like the first and second embodiments.

Figure 3:
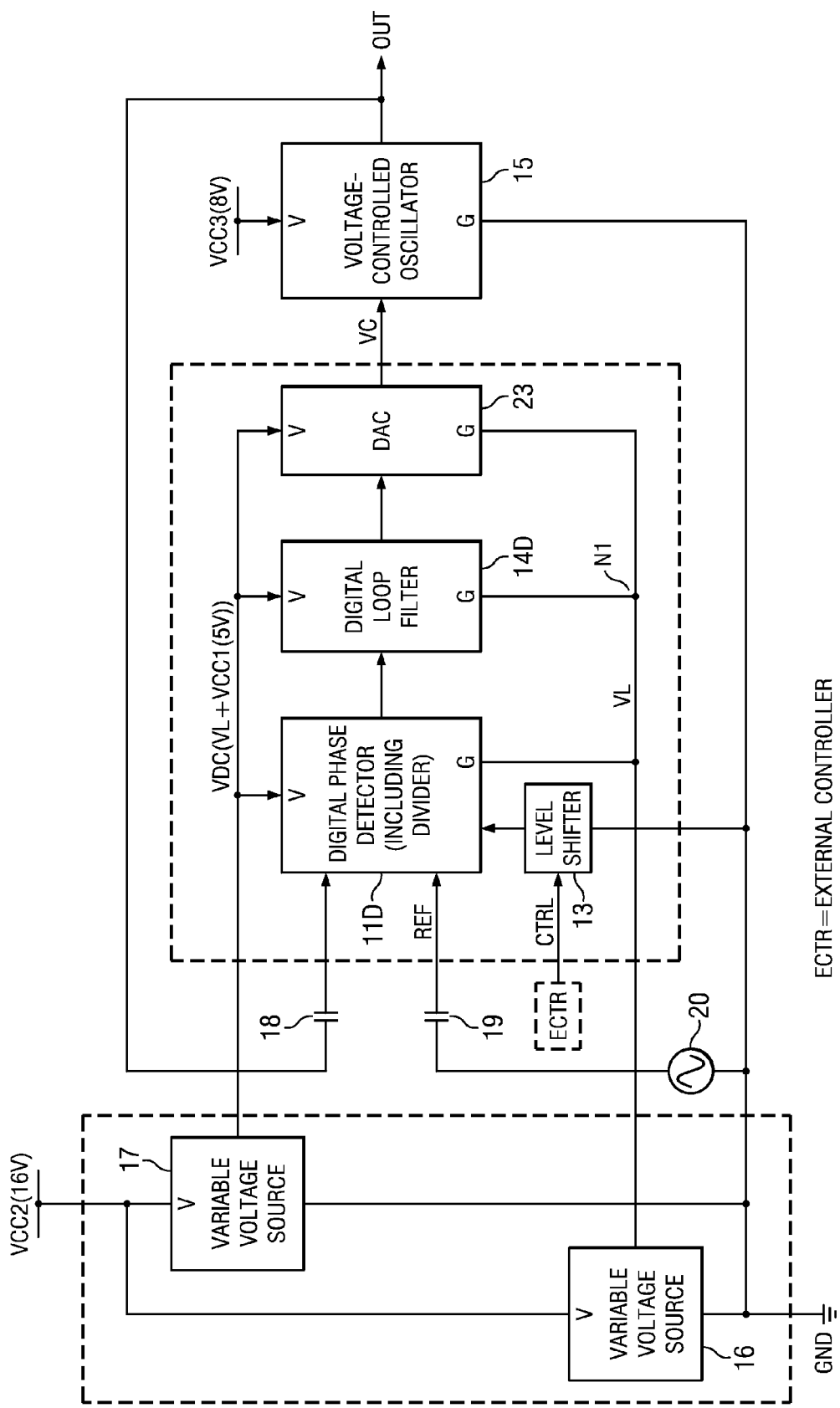
FIG. 3 is a configuration diagram showing a PLL circuit according to a third embodiment of the present invention.

As shown in FIG. 3, a PLL circuit of the third embodiment is an ADPLL circuit where the present invention is applied. The same structural elements as those in FIG. 1 will be denoted by the same reference numerals, and the duplicated explanation will be omitted below.

The PLL circuit of the third embodiment comprises a digital phase detector 11D, the level shifter 13, a digital loop filter 14D, a DAC 23, the VCO 15, and variable voltage sources 16, 17.

The digital phase detector 11D compares the phase of the output signal OUT of the VCO 15 with the phase of a reference frequency signal REF, quantizes the phase difference between the two signals, and outputs such a quantized discrete-time signal as the phase difference signal. Note that the digital phase detector 11D includes a divider which performs frequency division on the output signal OUT input from the VCO 15 according to a control signal CTRL supplied from an external controller or the like.

The digital loop filter 14D eliminates high-frequency components from the phase difference signal output by the digital phase detector 11D to generate a digital tuning control signal, and outputs the digital tuning control signal to the DAC 23. The DAC 23 converts the digital tuning control signal output by the digital loop filter 14D into a quantized analog tuning control voltage between 0 V to VCC1, and outputs such a voltage as a tuning control signal VC to the VCO 15.

Ground terminals G of the digital phase detector 11D, the digital loop filter 14D, and the DAC 23 are commonly connected to the variable voltage source 16, and a variable voltage VL is supplied thereto. Power-supply terminals V of the digital phase detector 11D, the digital loop filter 14D, and the DAC 23 are commonly connected to the variable voltage source 17, and a variable voltage VDC (=VL+VCC1) is supplied thereto. VCC1 is a fixed voltage, for example, 5 V. Another fixed voltage VCC3 (e.g. 8 V) is supplied to a power-supply terminal V of the VCO 15. The input voltage range of the tuning control signal for the VCO 15 is from 0 V to VCC2. VCC2 is a power-supply voltage supplied to the variable voltage sources 16, 17, and for example, is 16 V.

In the PLL circuit of the third embodiment, the digital phase detector 11D, the digital loop filter 14D, and the DAC 23 are able to operate with a net power-supply voltage VCC1, so that it is possible to configure those units as high speed-response circuits using low-voltage transistors.

Like the charge pump 12 of the first embodiment, the output voltage range of the DAC 23 is from VL to VL+VCC1. Therefore, as explained in the first embodiment, by changing the voltage VL, it is possible for the DAC 23 to input an arbitrary tuning control signal VC from 0 V to VCC2 to the VCO 15.

Figure 6:
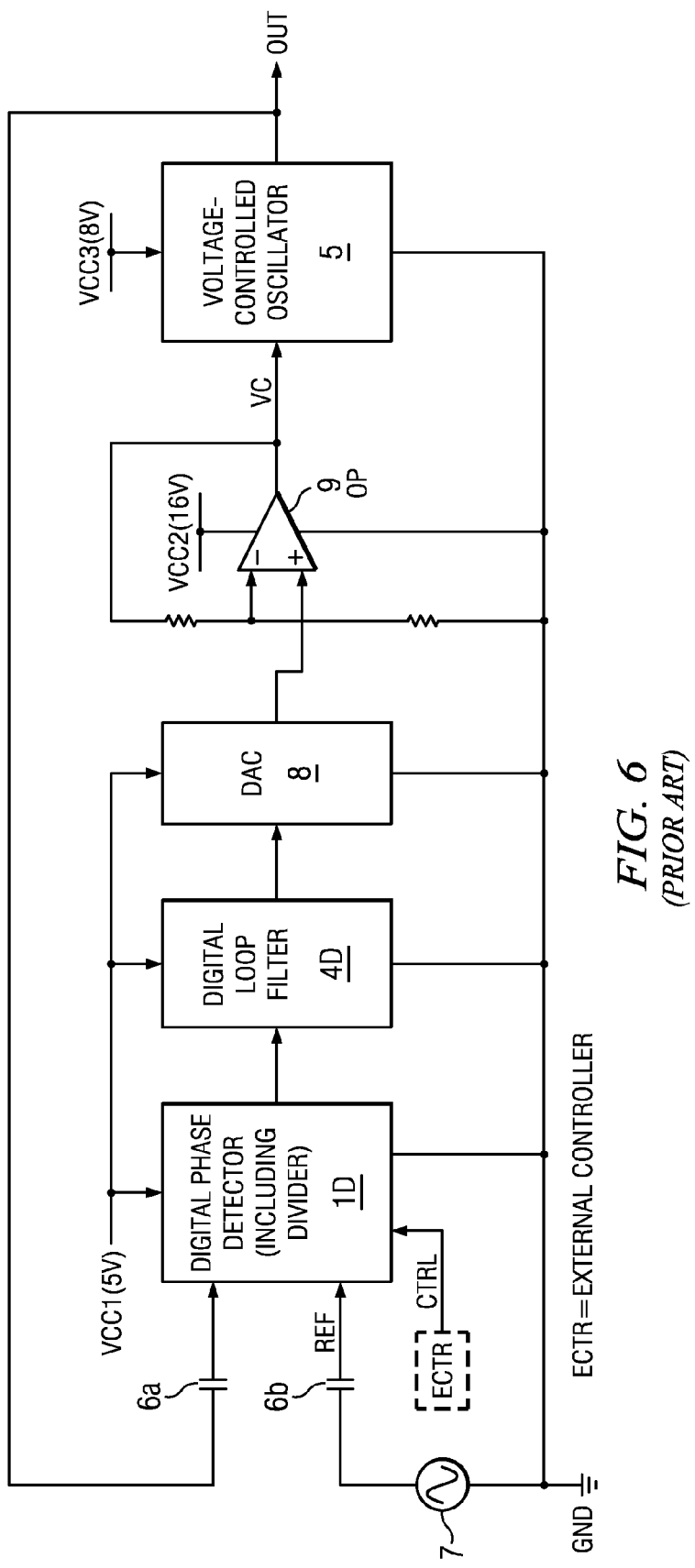
FIG. 6 is a configuration diagram showing a high-voltage ADPLL circuit of a second example conventional technology.

In comparison with the high-voltage ADPLL circuit (see FIG. 6) of the second example conventional technology, the PLL circuit of the third embodiment has following advantages.

(f) The DAC 23 and the VCO 15 are directly connected together to input the tuning control signal VC to the VCO 15 without using an operational amplifier comprised of high-voltage transistors. Accordingly, when the PLL circuit performs frequency modulation, it is possible to respond to a high speed modulation signal.

(g) Because no operational amplifier comprised of high-voltage transistors is used, the phase noise in an oscillation output of the PLL circuit does not suffer from the noise induced by the operational amplifier.

(h) Because the voltage resolution of the DAC 23 directly becomes the resolution of the tuning control signal VC, the frequency precision of the PLL circuit and the spurious characteristics thereof improve.

(i) Because the digital phase detector 11D, the digital loop filter 14D, and the DAC 23 always operate with a net power-supply voltage VCC1 regardless of the variable voltage VL, even if the maximum value of the variable voltage VDC, i.e., the power-supply voltage VCC2 is lowered to the maximum control voltage of the VCO 15 to be a voltage less than the maximum rated drain-source voltage of the high-voltage MOS transistor used in the PLL circuit, no performance degradation of the PLL circuit occurs like the first embodiment. Accordingly, it is possible to accomplish power saving of the PLL circuit while maintaining the performances.

(j) The tuning control signal VC is output by the DAC 23 comprised of low-voltage transistors, not by an operational amplifier comprised of high-voltage transistors. Accordingly, performance degradation is not likely to occur when the tuning control voltage is near the ground level GND, below the saturation voltage of the high-voltage transistor.

Therefore, the PLL circuit of the third embodiment can overcome the problems explained in (6) to (10).

The present invention is not limited to the foregoing embodiments, and can be changed and modified in various forms as explained below.

(A) The phase detector 11, 11A includes a divider in the foregoing embodiment, but the divider may be separately configured from the phase detector 11, 11A. In the case in which the divider is separately configured, the phase detector 11, 11A and the divider can be each comprised of low-voltage transistors, and can be built in the same integrated circuit. The divider may also perform frequency division on the reference frequency signal REF. Note that the divider is not an essential element for the PLL circuit. Also notice the divisor can be a fractional number, when a fractional divider is exploited.

(B) The PLL circuit in FIG. 1 has the level shifter 13 to match the level of the control signal CTRL with the input level of the divider in the phase detector 11. However, when the divisor is not programmable, but fixed and no control signal CTRL is used, the level shifter 13 becomes unnecessary.

(C) The phase detector 11, 11A can set the frequency division ratio of the divider based on the control signal CTRL from the exterior. However, an operating state of the PLL circuit like lock detect may be output to the exterior of the integrated circuit or a circuit grounded to the reference potential GND inside the integrated circuit. In this case, in the case of the first embodiment, an output level shifter which converts a logic signal represented by the potential VL and the potential VDC into a logic signal which can be input to an external controller grounded to the reference potential GND becomes requisite. Note that no level shifter is required in the case of the second embodiment.

Figure 4:
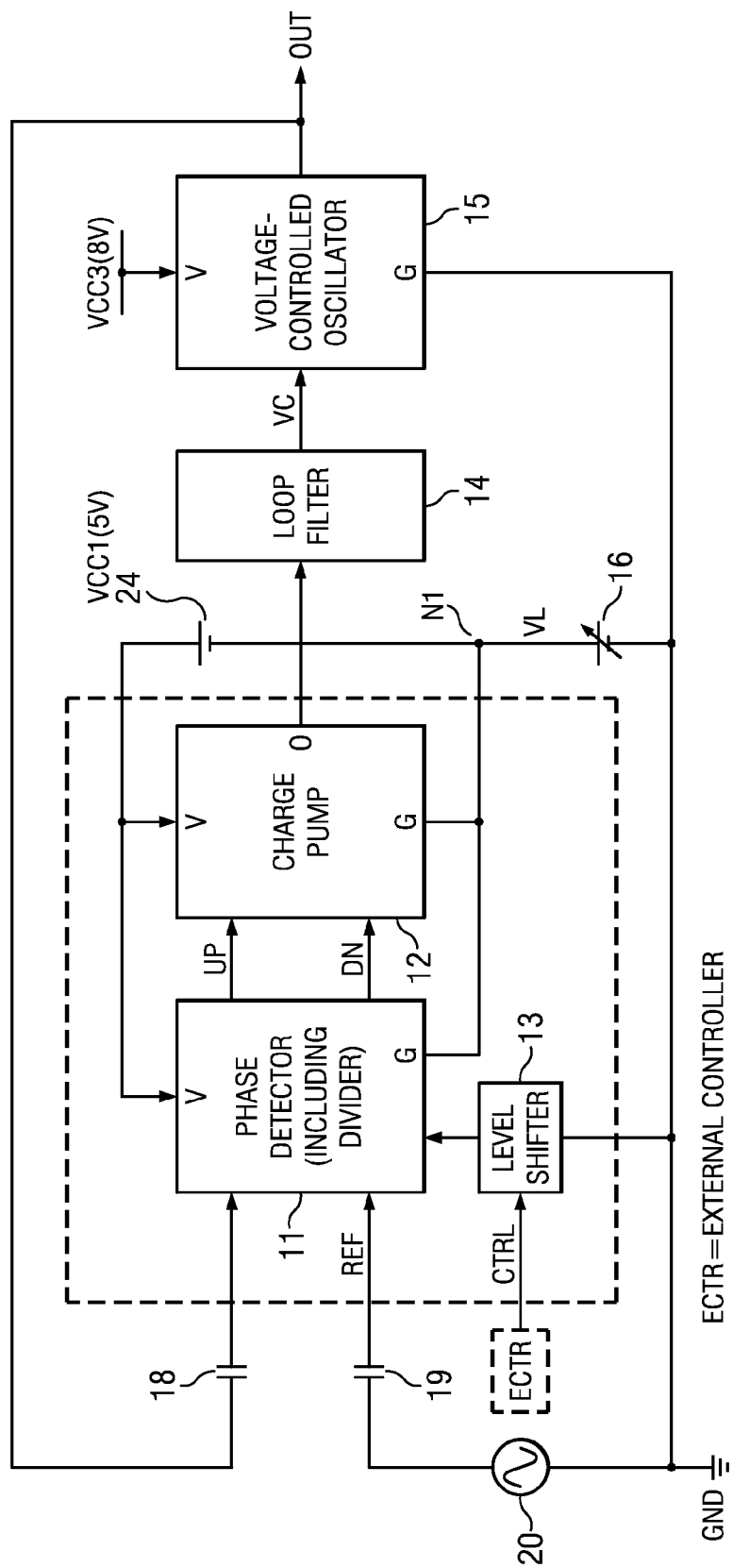
FIG. 4 is a configuration diagram showing a PLL circuit according to another embodiment of the present invention.

(D) The PLL circuit in FIG. 1 has two variable voltage sources 16, 17, but for example, as shown in FIG. 4, a fixed low-voltage source 24 (power-supply voltage VCC1) may be connected between the power-supply terminal V of the phase detector 11 and that of the charge pump 12, and the node N1 instead of the variable voltage source 17. In this case, by causing unnecessary current not to flow into the variable voltage source 16 like the second embodiment, it is possible to reduce the power consumption of the whole PLL circuit in comparison with the first embodiment.

(E) In FIGS. 1, 2, and 4, a typical tri-state phase detector using two kinds of pulse signals: UP; and DN is used as the phase detector. However, other kinds of phase detectors, e.g., an XOR (exclusive OR) phase detector, can be used.

(F) Like the third embodiment, the PLL circuit of the second embodiment can be digitized as a high-voltage ADPLL circuit.

(G) It is not always necessary that the structural elements surrounded by a dashed line in FIGS. 1 to 4 are configured as a single integrated circuit. For example, in FIG. 1, the variable voltage sources 16, 17 and the level shifter 13 may be subjected to integration on a chip A through a semiconductor manufacturing process for high-voltage transistors, and the phase detector 11 including the divider and the charge pump 12 may be subjected to integration on a chip B through a semiconductor manufacturing process for high speed and low-voltage transistors. Employment of the several-chip configuration may enable to optimize the trade-off between development time, manufacturing cost, and chip size shrink.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A phase locked loop circuit which operates with, relative to a reference ground potential, a first supply voltage and a second supply voltage higher than the first supply voltage by a constant voltage, comprising:

a first variable voltage source which supplies the first supply voltage;

a second variable voltage source which supplies the second supply voltage;

a phase detector which operates with a potential difference between the first supply voltage and the second supply voltage, compares a phase of an output signal input to the phase detector with a phase of a reference frequency signal, and outputs a phase difference signal corresponding to a phase difference between the output signal and the reference frequency signal;

a charge pump which operates, as a power-supply voltage, with a potential difference between the first supply voltage and the second supply voltage, and outputs a positive or negative constant current signal corresponding to the phase difference signal supplied from the phase detector;

a loop filter which integrates the constant current pulse signal output by the charge pump to generate a tuning control signal, and outputs the tuning control signal; and a voltage-controlled oscillator which has an input voltage range of the tuning control signal between the reference ground potential and a third supply voltage, generates the output signal having an oscillation frequency controlled by the tuning control signal, and outputs the generated output signal.

2. The phase locked loop circuit according to claim 1, wherein the first variable voltage source, the second variable voltage source, the phase detector, and the charge pump are integrated on at least one semiconductor die.

3. The phase locked loop circuit according to claim 1, further comprising a divider which performs frequency division on the output signal of the voltage-controlled oscillator according to a control signal supplied from an external controller, and supplies the signal having undergone frequency division to the phase detector.

4. The phase locked loop circuit according to claim 3, wherein the control signal is supplied from the external controller as a first logic signal representing a logical value 0 with the reference ground potential and a logical value 1 with a fixed fourth supply voltage, and the phase locked loop circuit further comprises a level shifter which converts the first logic signal into a second logic signal representing a logical value 0 and 1 by the first supply voltage and the second supply voltage respectively, and supplies the second logic signal to the divider.

5. The phase locked loop circuit according to claim 4, wherein the first variable voltage source, the second variable voltage source, the phase detector, the charge pump, the divider and the level shifter are integrated on at least one semiconductor die.

* * * * *